(12) United States Patent
Guo

(10) Patent No.: US 11,778,804 B2
(45) Date of Patent: Oct. 3, 2023

(54) CAPACITOR ARRAY STRUCTURE AND FABRICATION METHOD THEREOF

(71) Applicant: CHANGXIN MEMORY TECHNOLOGIES, INC., Hefei (CN)

(72) Inventor: Shuai Guo, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 130 days.

(21) Appl. No.: 17/474,054

(22) Filed: Sep. 14, 2021

(65) Prior Publication Data

US 2022/0320100 A1    Oct. 6, 2022

Related U.S. Application Data

(63) Continuation of application No. PCT/CN2021/107821, filed on Jul. 22, 2021.

(30) Foreign Application Priority Data

Apr. 2, 2021    (CN) .......................... 202110360663.4

(51) Int. Cl.
    *H10B 12/00*    (2023.01)
(52) U.S. Cl.
    CPC ......... *H10B 12/033* (2023.02); *H10B 12/315* (2023.02); *H10B 12/34* (2023.02)
(58) Field of Classification Search
    CPC ..... H10B 12/033; H10B 12/315; H10B 12/34
    See application file for complete search history.

(56) References Cited

U.S. PATENT DOCUMENTS

2008/0128773 A1    6/2008  Moll et al.
2021/0202490 A1*   7/2021  Cho ...................... H10B 12/318

FOREIGN PATENT DOCUMENTS

| CN | 107863351 A | 3/2018 |
| CN | 210296415 U | 4/2020 |
| CN | 111106095 A | 5/2020 |
| CN | 111223343 A | 6/2020 |
| CN | 111799273 A | 10/2020 |

* cited by examiner

*Primary Examiner* — Robert G Bachner
*Assistant Examiner* — Molly K Reida
(74) *Attorney, Agent, or Firm* — KILPATRICK TOWNSEND & STOCKTON LLP

(57) ABSTRACT

Embodiments disclose a capacitor array structure and a method for fabricating a capacitor array structure. The method includes: after forming a first capacitor hole, providing a bonded wafer including a second substrate, a second supporting layer and a second sacrificial layer stacked in sequence, and bonding the bonded wafer to a stacked structure, wherein a surface of the second sacrificial layer away from the second supporting layer is a bonding surface; forming a second capacitor hole, the second capacitor hole penetrating into the bonded wafer at least along a thickness direction to expose the first capacitor hole, such that the first capacitor hole is connected with the second capacitor hole.

15 Claims, 9 Drawing Sheets

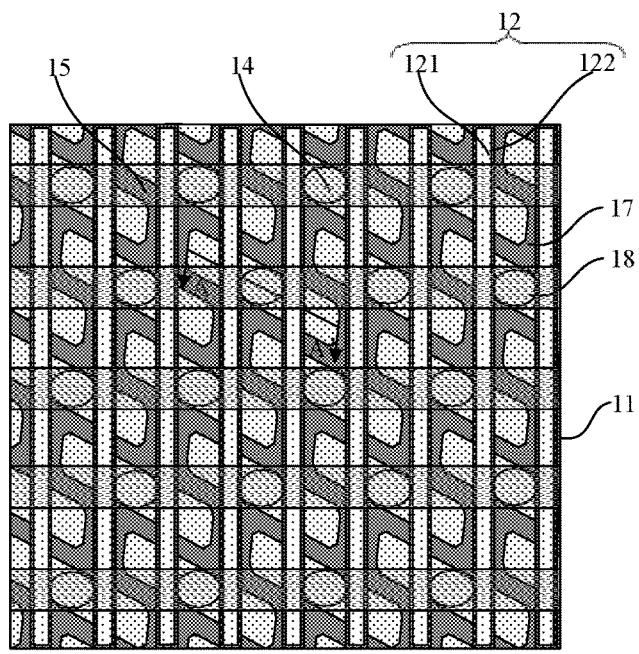
FIG. 2
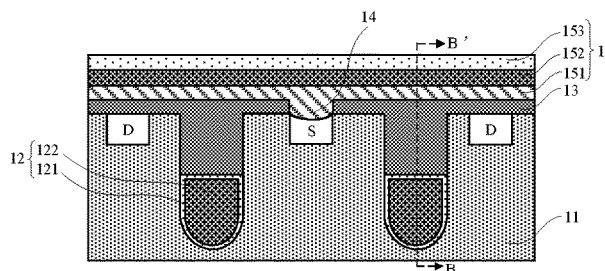
Fig.3(a)
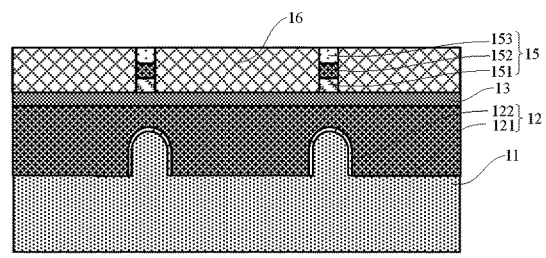
Fig.3(b)
FIG. 3
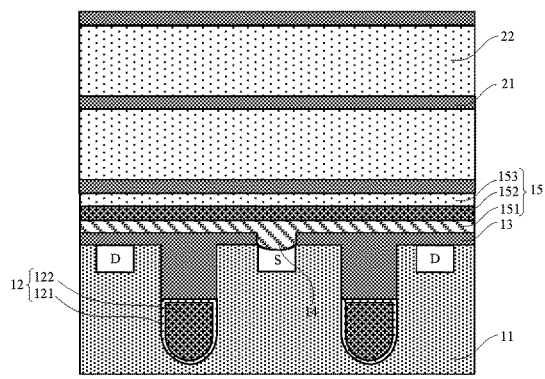
Fig.4(a)
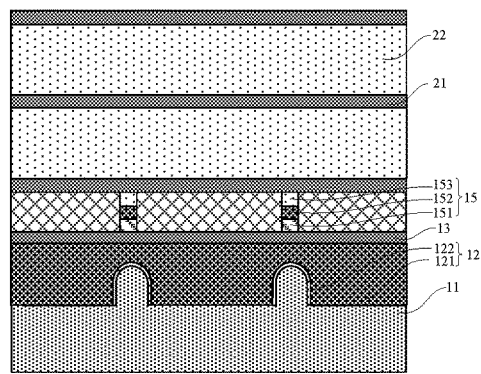
Fig.4(b)
FIG. 4

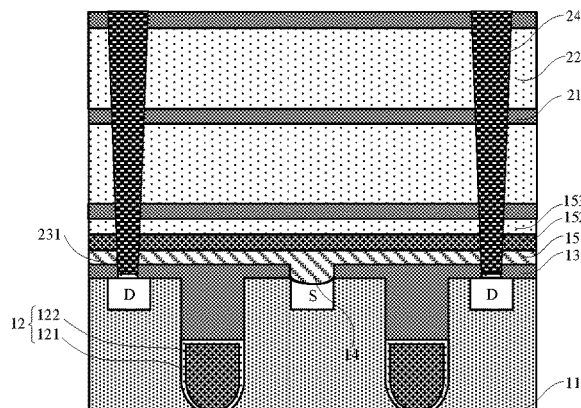 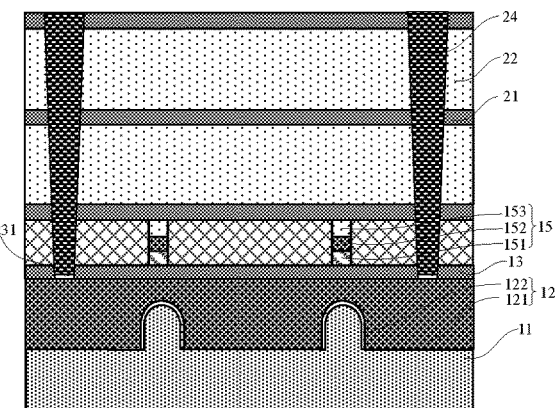
Fig.7(a)      Fig.7(b)
FIG. 7
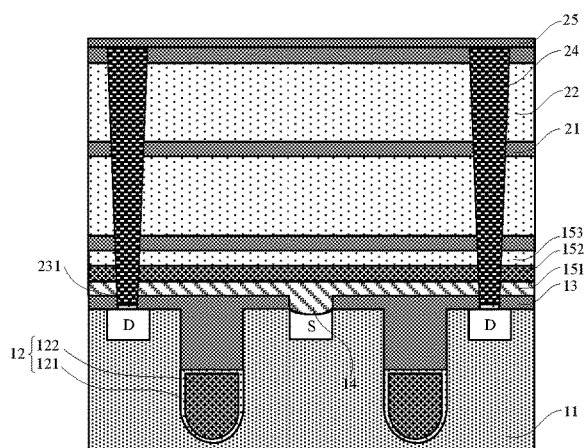 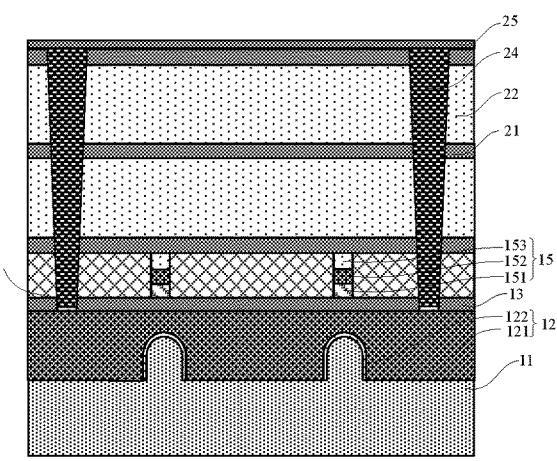
Fig.8(a)      Fig.8(b)
FIG. 8
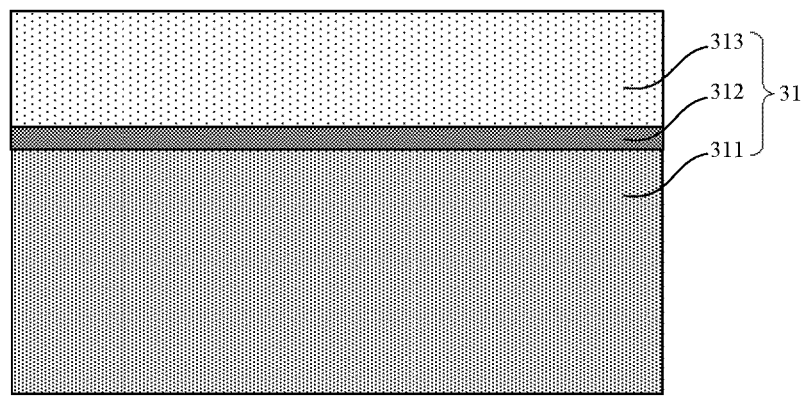
FIG. 9

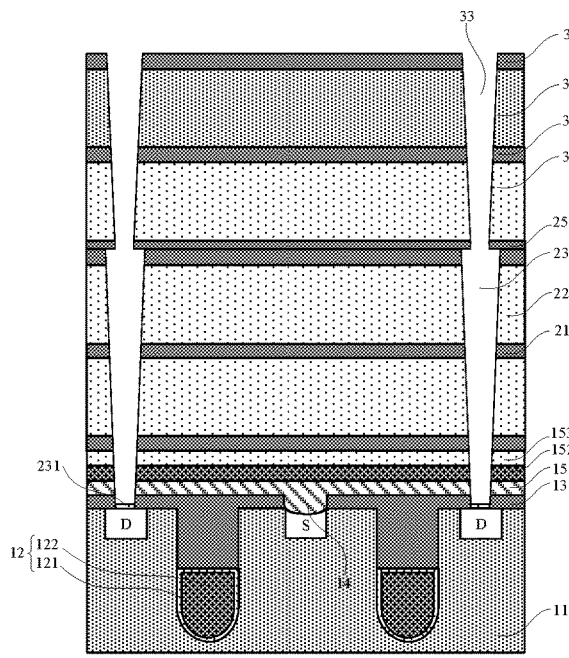 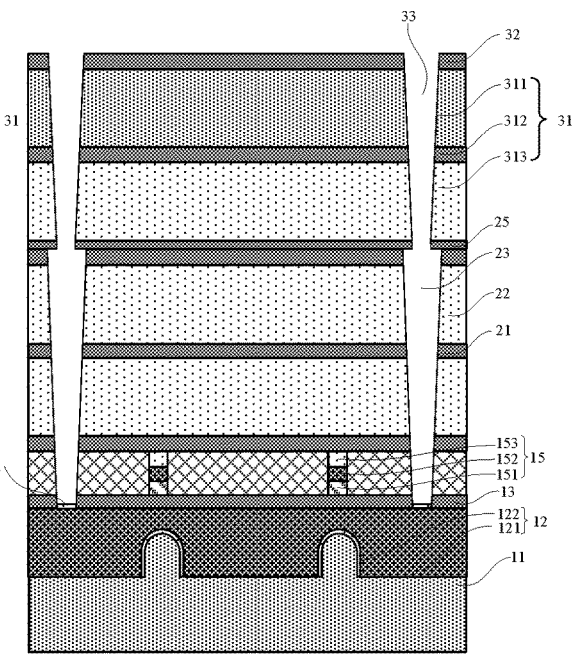
Fig.14(a)      Fig.14(b)
FIG 14
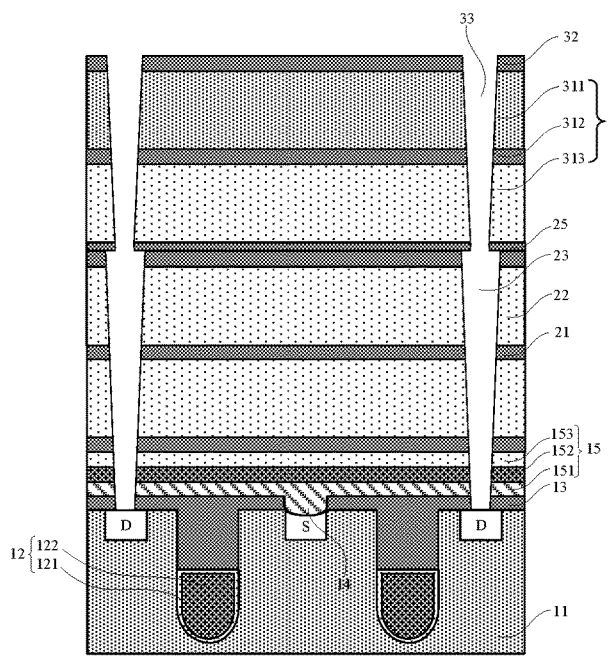 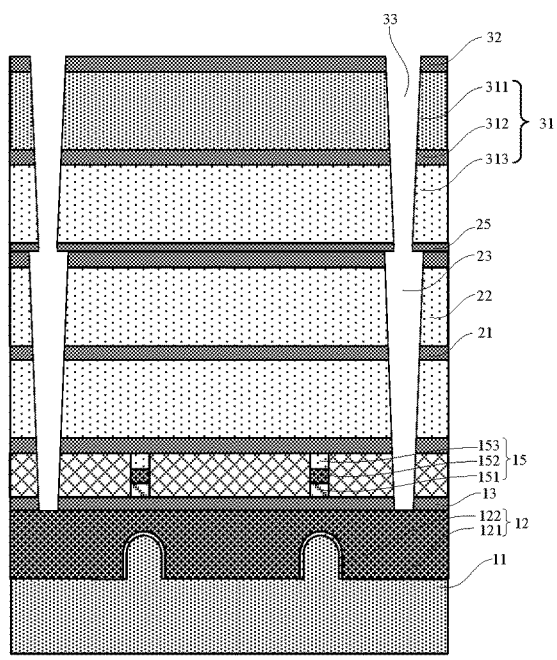
Fig.15(a)      Fig.15(b)
FIG 15

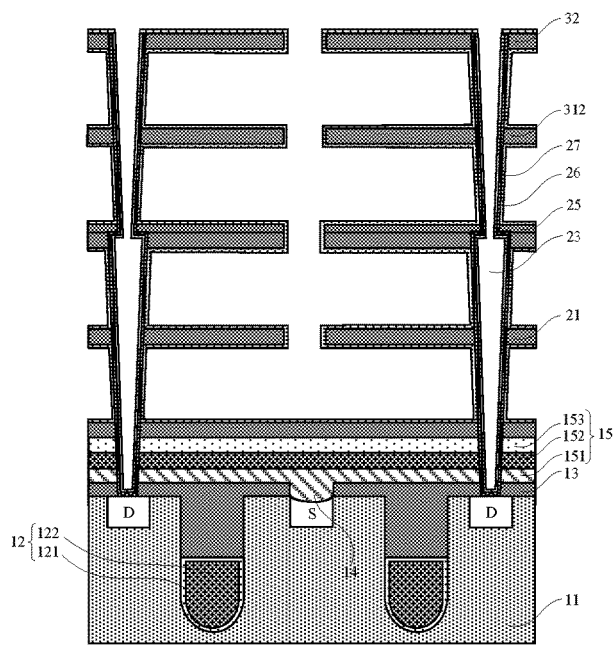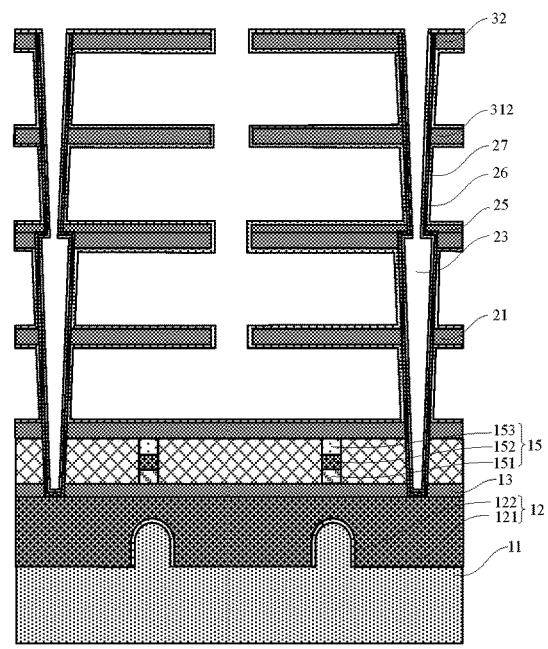
Fig.18(a)  Fig.18(b)
FIG. 18
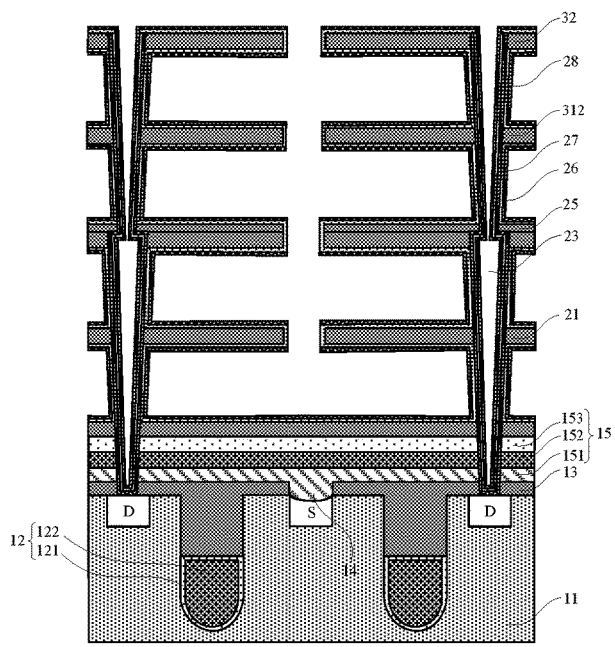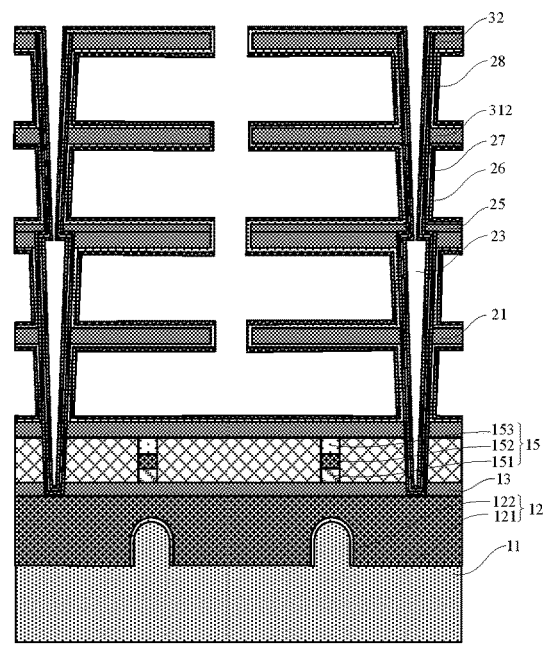
Fig.19(a)  Fig.19(b)
FIG. 19

CAPACITOR ARRAY STRUCTURE AND FABRICATION METHOD THEREOF

CROSS-REFERENCE TO RELATED APPLICATION

This application is a continuation of PCT/CN2021/107821, filed on Jul. 22, 2021, which claims priority to Chinese Patent Application No. 202110360663.4 titled "CAPACITOR ARRAY STRUCTURE AND FABRICATION METHOD THEREOF" and filed to the State Intellectual Property Office on Apr. 2, 2021, the entire contents of which are incorporated herein by reference.

TECHNICAL FIELD

The present disclosure relates to the field of chip fabrication, and more particularly, to a capacitor array structure and fabrication method thereof.

BACKGROUND

As a semiconductor memory device commonly used in computers, Dynamic Random Access Memory (DRAM) comprises a plurality of repeated memory cells. As DRAM devices develop toward higher storage density, how to reduce a line width of a capacitor is a key means. However, as the line width of the capacitor is reduced, a size of the capacitor is also reduced accordingly, causing a storage capacitor to further reduce with respect to a bit line parasitic capacitor, thus resulting in failure of distinguishing a signal of stored data. Nowadays, to keep the size of the capacitor unchanged and reduce the line width of the storage capacitor, a strategy of increasing a height of the capacitor is adopted. However, increasing the height of the capacitor may increase difficulty of a capacitor etching process, which has become an important research direction for the development of DRAM fabrication procedures.

SUMMARY

A first aspect of the present disclosure provides a capacitor array structure, comprising:
a semiconductor structure;
a plurality of first supporting layers arranged in parallel at intervals on the semiconductor structure;
a first capacitor hole, the first capacitor hole penetrating into each of the plurality of first supporting layers at least along a thickness direction to expose the semiconductor structure;
a second supporting layer, bonded to the semiconductor structure, a spacing being provided between the second supporting layer and one of the plurality of first supporting layers positioned on a top layer;
a third supporting layer, positioned on the second supporting layer, a spacing being provided between the third supporting layer and the second supporting layer;
a second capacitor hole, correspondingly arranged with respect to the first capacitor hole, the second capacitor hole penetrating into the third supporting layer and the second supporting layer at least along the thickness direction to connect with the first capacitor hole;
a first electrode layer, covering a sidewall of the first capacitor hole, a bottom of the first capacitor hole, and a sidewall of the second capacitor hole;
a capacitor dielectric layer, covering a surface of the first electrode layer; and
a second electrode layer, covering a surface of the capacitor dielectric layer.

A second aspect of the present disclosure provides a method for fabricating a capacitor array structure, comprising:
providing a semiconductor structure;
forming, on the semiconductor structure, a stacked structure comprising a first sacrificial layer and a first supporting layer alternately stacked from up to down;
forming a first capacitor hole, the first capacitor hole penetrating into the stacked structure at least along a thickness direction;
providing a bonded wafer comprising a second substrate, a second supporting layer and a second sacrificial layer stacked in sequence;
bonding the bonded wafer to the stacked structure, wherein a surface of the second sacrificial layer keeping away from the second supporting layer is a bonding surface;
forming a third supporting layer on a surface of the second substrate keeping away from the second supporting layer;
forming a second capacitor hole, the second capacitor hole penetrating into the bonded wafer at least along the thickness direction to connect with the first capacitor hole;
forming a first electrode layer on a sidewall of the first capacitor hole, a bottom of the first capacitor hole and a sidewall of the second capacitor hole;
sequentially removing the second substrate, the second sacrificial layer, and the first sacrificial layer;
forming a capacitor dielectric layer on a surface of the first electrode layer; and
forming a second electrode layer on a surface of the capacitor dielectric layer.

The above description is merely an overview of the technical solutions of the present disclosure, in order that the technical means of the present disclosure can be more clearly understood and they may be embodied according the content of the specification, the technical solutions of the present disclosure will be described in detail below with reference to some embodiments of the present disclosure and accompanying drawings.

BRIEF DESCRIPTION OF THE DRAWINGS

To describe the technical solutions of the embodiments of the present disclosure more clearly, the accompanying drawings required for describing the embodiments will be briefly introduced below. Apparently, the accompanying drawings in the following description are merely some embodiments of the present disclosure. To those of ordinary skills in the art, other accompanying drawings may also be derived from these accompanying drawings without creative efforts.

FIG. 2 and FIG. 3 illustrate schematic structural diagrams of a semiconductor structure according to an embodiment of the present disclosure, wherein FIG. 2 illustrates a vertical view of the semiconductor structure, FIG. 3 illustrates a cross-sectional structural schematic diagram of FIG. 2, FIG. 3(a) illustrates a partial cross-sectional structural schematic diagram intercepted along a direction AA' in FIG. 2, and FIG. 3(b) illustrates a partial cross-sectional structural schematic diagram intercepted along a direction BB' in FIG. 3(a);

FIG. 4 illustrates a partial cross-sectional structural schematic diagram of forming a stacked structure according to an embodiment of the present disclosure, wherein FIG. 4(a)

illustrates a partial cross-sectional structural schematic diagram intercepted along the direction AA' in FIG. 2, and FIG. 4(b) illustrates a partial cross-sectional structural schematic diagram intercepted along the direction BB' in FIG. 3(a);

FIG. 5 illustrates a partial cross-sectional structural schematic diagram of forming a first capacitor hole according to an embodiment of the present disclosure, wherein FIG. 5(a) illustrates a partial cross-sectional structural schematic diagram intercepted along the direction AA' in FIG. 2, and FIG. 5(b) illustrates a partial cross-sectional structural schematic diagram intercepted along the direction BB' in FIG. 3(a);

FIG. 6 illustrates a partial cross-sectional structural schematic diagram of forming a protective layer at a bottom of the first capacitor hole according to an embodiment of the present disclosure, wherein FIG. 6(a) illustrates a partial cross-sectional structural schematic diagram intercepted along the direction AA' in FIG. 2, and FIG. 6(b) illustrates a partial cross-sectional structural schematic diagram intercepted along the direction BB' in FIG. 3(a);

FIG. 7 illustrates a partial cross-sectional structural schematic diagram of forming a filling sacrificial layer in the first capacitor hole according to an embodiment of the present disclosure, wherein FIG. 7(a) illustrates a partial cross-sectional structural schematic diagram intercepted along the direction AA' in FIG. 2, and FIG. 7(b) illustrates a partial cross-sectional structural schematic diagram intercepted along the direction BB' in FIG. 3(a);

FIG. 8 illustrates a partial cross-sectional structural schematic diagram of forming a fourth supporting layer on a surface of the stacked structure according to an embodiment of the present disclosure, wherein FIG. 8(a) illustrates a partial cross-sectional structural schematic diagram intercepted along the direction AA' in FIG. 2, and FIG. 8(b) illustrates a partial cross-sectional structural schematic diagram intercepted along the direction BB' in FIG. 3(a);

FIG. 9 is a schematic structural diagram of a bonded wafer according to an embodiment of the present disclosure;

FIG. 10 illustrates a partial cross-sectional structural schematic diagram of bonding the bonded wafer on the stacked structure according to an embodiment of the present disclosure, wherein FIG. 10(a) illustrates a partial cross-sectional structural schematic diagram intercepted along the direction AA' in FIG. 2, and FIG. 10(b) illustrates a partial cross-sectional structural schematic diagram intercepted along the direction BB' in FIG. 3(a);

FIG. 11 illustrates a partial cross-sectional structural schematic diagram of a second substrate thinned according to an embodiment of the present disclosure, wherein FIG. 11(a) illustrates a partial cross-sectional structural schematic diagram intercepted along the direction AA' in FIG. 2, and FIG. 11(b) illustrates a partial cross-sectional structural schematic diagram intercepted along the direction BB' in FIG. 3(a);

FIG. 12 illustrates a partial cross-sectional structural schematic diagram of forming a third supporting layer on a surface of the second substrate according to an embodiment of the present disclosure, wherein FIG. 12(a) illustrates a partial cross-sectional structural schematic diagram intercepted along the direction AA' in FIG. 2, and FIG. 12(b) illustrates a partial cross-sectional structural schematic diagram intercepted along the direction BB' in FIG. 3(a);

FIG. 13 illustrates a partial cross-sectional structural schematic diagram of forming a second capacitor hole according to an embodiment of the present disclosure, wherein FIG. 13(a) illustrates a partial cross-sectional structural schematic diagram intercepted along the direction AA' in FIG. 2, and FIG. 13(b) illustrates a partial cross-sectional structural schematic diagram intercepted along the direction BB' in FIG. 3(a);

FIG. 14 illustrates a partial cross-sectional structural schematic diagram obtained after the filling sacrificial layer is removed according to an embodiment of the present disclosure, wherein FIG. 14(a) illustrates a partial cross-sectional structural schematic diagram intercepted along the direction AA' in FIG. 2, and FIG. 14(b) illustrates a partial cross-sectional structural schematic diagram intercepted along the direction BB' in FIG. 3(a);

FIG. 15 illustrates a partial cross-sectional structural schematic diagram obtained after the protective layer is removed according to an embodiment of the present disclosure, wherein FIG. 15(a) illustrates a partial cross-sectional structural schematic diagram intercepted along the direction AA' in FIG. 2, and FIG. 15(b) illustrates a partial cross-sectional structural schematic diagram intercepted along the direction BB' in FIG. 3(a);

FIG. 16 illustrates a partial cross-sectional structural schematic diagram of forming a first electrode layer according to an embodiment of the present disclosure, wherein FIG. 16(a) illustrates a partial cross-sectional structural schematic diagram intercepted along the direction AA' in FIG. 2, and FIG. 16(b) illustrates a partial cross-sectional structural schematic diagram intercepted along the direction BB' in FIG. 3(a);

FIG. 17 illustrates a partial cross-sectional structural schematic diagram obtained after the second substrate, a second sacrificial layer and a first sacrificial layer are removed in sequence based on openings according to an embodiment of the present disclosure, wherein FIG. 17(a) illustrates a partial cross-sectional structural schematic diagram intercepted along the direction AA' in FIG. 2, and FIG. 17(b) illustrates a partial cross-sectional structural schematic diagram intercepted along the direction BB' in FIG. 3(a);

FIG. 18 illustrates a partial cross-sectional structural schematic diagram of forming a capacitor dielectric layer according to an embodiment of the present disclosure, wherein FIG. 18(a) illustrates a partial cross-sectional structural schematic diagram intercepted along the direction AA' in FIG. 2, and FIG. 18(b) illustrates a partial cross-sectional structural schematic diagram intercepted along the direction BB' in FIG. 3(a); and FIG. 19 illustrates a partial cross-sectional structural schematic diagram of forming a second electrode layer according to an embodiment of the present disclosure, wherein FIG. 19(a) illustrates a partial cross-sectional structural schematic diagram intercepted along the direction AA' in FIG. 2, and FIG. 19(b) illustrates a partial cross-sectional structural schematic diagram intercepted along the direction BB' in FIG. 3(a).

DETAILED DESCRIPTION

Figure 1:
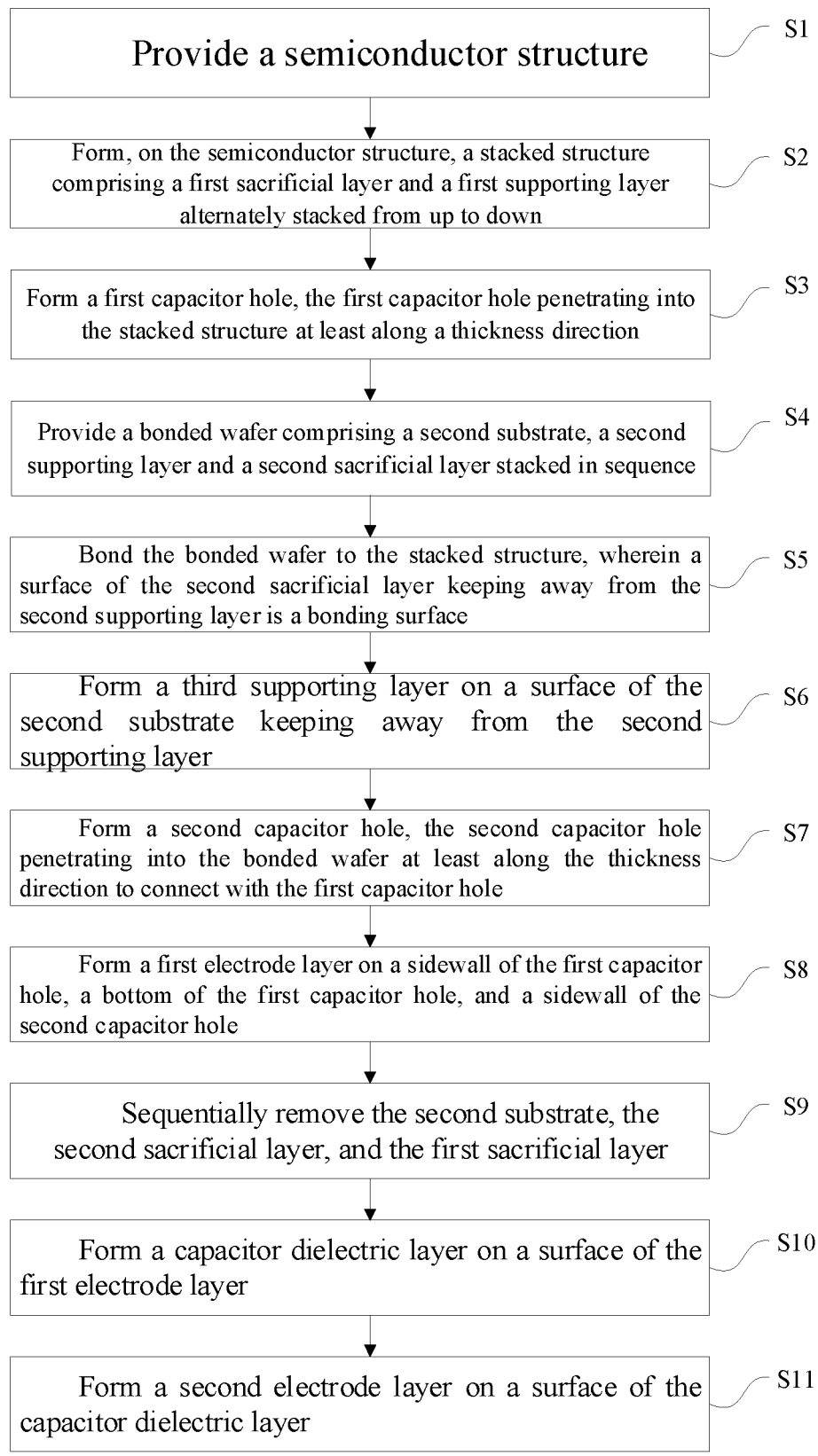
FIG. 1 is a schematic flow diagram of a method for fabricating a capacitor array structure according to an embodiment of the present disclosure.

For ease of understanding the present disclosure, the present disclosure will be described more fully hereinafter with reference to the accompanying drawings. Some embodiments of the present disclosure are provided in the accompanying drawings. The present disclosure may, however, be embodied in many different forms and should not be limited to the embodiments set forth herein. Rather, these embodiments are provided so that the present disclosure will be more thorough and complete.

Unless otherwise defined, all technical and scientific terms employed herein have the same meaning as commonly understood by one of ordinary skill in the art to which the present disclosure belongs. The terms employed in the specification of the present disclosure are merely for the purpose of describing some embodiments and are not intended for limiting the present disclosure. As used herein, the term "and/or" includes any and all combinations of one or more of the associated listed items.

It should be understood that when an element or layer is referred to as being "on", "adjacent to", "connected to" or "coupled to" other elements or layers, it may be directly on, adjacent to, connected or coupled to the other elements or layers, or intervening elements or layers may be present. In contrast, when an element is referred to as being "directly on", "directly adjacent to", "directly connected to" or "directly coupled to" other elements or layers, there are no intervening elements or layers present. It should be understood that although the terms first, second, third, etc. may be employed to describe various elements, components, regions, layers and/or sections, these elements, components, regions, layers and/or sections should not be limited by these terms. These terms are only employed to distinguish one element, component, region, layer or section from another element, component, region, layer or section. Therefore, without departing from the teachings of the present disclosure, a first element, component, region, layer or section discussed below may be represented as a second element, component, region, layer or section.

Spatially relative terms such as "below", "under", "lower", "beneath", "above", "upper" and the like may be used herein for ease of description to describe relationships between one element or feature as shown in the figures and another element(s) or feature(s). It should be understood that the spatially relative terms may be intended to encompass different orientations of the device in use or operation in addition to the orientation depicted in the figures. For example, if the device in the figures is turned over, elements or features described as "under", "beneath" or "below" other elements would then be oriented "above" the other elements or features. Thus, the exemplary term "under", "below" or "beneath" may encompass both an orientation of above and below. The device may be otherwise oriented (rotated 90 degrees or at other orientations) and the spatially relative descriptors used herein should be interpreted accordingly.

The terminology used herein is for the purpose of describing some embodiments only and is not intended to limit the present disclosure. As used herein, the singular forms of "a", "one" and "said/the" are also intended to include plural forms, unless the context clearly indicates otherwise. It should also be understood that the terms "comprising" and/or "including", when used in this specification, determine the presence of the described features, integers, steps, operations, elements and/or components, but do not preclude the presence or addition of one or more other features, integers, steps, operations, elements, components, and/or groups thereof. As used herein, the term "and/or" includes any and all combinations of related listed items.

Embodiments of the present disclosure are described herein with reference to cross-sectional illustrations serving as schematic illustrations of idealized embodiments (and intermediate structures) of the present disclosure. As such, variations from the shapes of the illustrations as a result, for example, of manufacturing techniques and/or tolerances, may be expected. Thus, embodiments of the present disclosure should not be construed as being limited to particular shapes of regions illustrated herein but may include deviations in shapes that result, for example, from manufacturing. Thus, regions illustrated in the figures are schematic in nature and their shapes do not necessarily illustrate the actual shape of a region of a device and do not limit the scope of the present disclosure.

In one embodiment of the present disclosure, a method for fabricating a capacitor array structure is provided. As shown in FIG. 1, this method includes following steps:

Step S1: providing a semiconductor structure;

Step S2: forming, on the semiconductor structure, a stacked structure comprising a first sacrificial layer and a first supporting layer alternately stacked from up to down;

Step S3: forming a first capacitor hole, the first capacitor hole penetrating into the stacked structure at least along a thickness direction;

Step S4: providing a bonded wafer comprising a second substrate, a second supporting layer and a second sacrificial layer stacked in sequence;

Step S5: bonding the bonded wafer to the stacked structure, wherein a surface of the second sacrificial layer keeping away from the second supporting layer is a bonding surface;

Step S6: forming a third supporting layer on a surface of the second substrate keeping away from the second supporting layer;

Step S7: forming a second capacitor hole, the second capacitor hole penetrating into the bonded wafer at least along the thickness direction to connect with the first capacitor hole;

Step S8: forming a first electrode layer on a sidewall of the first capacitor hole, a bottom of the first capacitor hole, and a sidewall of the second capacitor hole;

Step S9: sequentially removing the second substrate, the second sacrificial layer, and the first sacrificial layer;

Step S10: forming a capacitor dielectric layer on a surface of the first electrode layer; and Step S11: forming a second electrode layer on a surface of the capacitor dielectric layer.

In the method for fabricating a capacitor array structure provided by the above embodiments, after the first capacitor hole is formed, the method also includes: providing a bonded wafer including a second substrate, a second supporting layer and a second sacrificial layer stacked in sequence, and bonding the bonded wafer to a stacked structure, wherein a surface of the second sacrificial layer away from the second supporting layer is a bonding surface; forming a second capacitor hole, the second capacitor hole penetrating into the bonded wafer at least along a thickness direction to expose the first capacitor hole, such that the first capacitor hole is connected with the second capacitor hole. Difficulty of a capacitor etching process can be effectively reduced by means of a wafer bonding process, such that a height of a capacitor is increased while a line width of the capacitor is reduced. In this way, capacity of a storage capacitor and storage density of a DRAM are improved, and a technical idea is provided for development of DRAM fabrication procedures.

In one embodiment, as shown in FIGS. 2 to 3, the semiconductor structure provided in Step S1 includes a first substrate 11, wherein the first substrate 11 may include, but is not limited to, a Si substrate.

In one embodiment, with continued reference to FIGS. 2 to 3, a shallow trench isolation structure 17 is formed in the first substrate 11, and a plurality of active regions 18 arranged in an array are isolated in the first substrate 11 by the shallow trench isolation structure 17. The semiconductor structure further comprises a plurality of buried gate word lines 12 and a plurality of bit lines 15, wherein the plurality of buried gate word lines 12 extend along a first direction, the plurality of bit lines extend in a second direction, and the first direction and the second direction have an angle greater than 0° and less than or equal to 90°. In some embodiments, the angle may be 1°, 2°, 10°, 30°, 50°, 70°, or 90°, etc. Each of the plurality of active regions 18 stretches across two of the plurality of buried gate word lines 12, a source region S and a drain region D are formed in each of the plurality of active regions 18, wherein the source region S is positioned between two of the plurality of buried gate word lines 12 stretched across by each of the plurality of active regions 18, and the drain region D is positioned outside two of the plurality of buried gate word lines 12 stretched across by each of the plurality of active regions 18.

In one embodiment, with continued reference to FIG. 3, each of the plurality of buried gate word lines 12 includes a gate dielectric layer 121 and a word line conductive layer 122. The word line conductive layer 122 and the gate dielectric layer 121 are formed in a shallow trench (not shown). The word line conductive layer 122 is positioned on a sidewall and a bottom of the trench and covers the gate dielectric layer 121, wherein an upper surface of the word line conductive layer 122 is lower than an upper surface of the first substrate 11.

As an example, a material of the first word line conductive layer 233 may include arsenic (As) or boron (B) doped silicon, or phosphorus (P) or arsenic (As) doped germanium (Ge), tungsten (W), titanium (Ti), titanium nitride (TiN), or gold (Au). A material of the gate dielectric layer 121 may include, but is not limited to, silicon oxide or silicon nitride. The gate dielectric layer 121 is formed by means of an atomic layer deposition (ALD) process, a plasma chemical vapor deposition (PCVD) process, or a rapid thermal oxidation (RTO) process.

In one embodiment, with continued reference to FIG. 3, a first insulating layer 13 is formed in the semiconductor structure, wherein the first insulating layer 13 is positioned on an upper surface of each of the plurality of buried gate word lines 12 and the upper surface of the first substrate 11. Each of the plurality of bit lines 15 is connected to the source region S via a bit line contact structure 14.

As an example, a material of the first insulating layer 13 may include, but is not limited to, silicon oxide, silicon nitride, or silicon oxynitride, etc. A material of the bit line contact structure 14 may include, but is not limited to, polycrystalline silicon.

In one embodiment, with continued reference to FIG. 3, each of the plurality of bit lines 15 comprises a first conductive layer 151, a second conductive layer 152 and a bit line insulating layer 153 sequentially stacked from bottom to top. The first conductive layer 151 is positioned on an upper surface of the first insulating layer 13, and the first conductive layer 151 is connected to the source region S via the bit line contact structure 14.

As an example, a material of the first conductive layer 151 may include, but is not limited to, polycrystalline silicon, metallic tungsten, or metallic copper, etc. In this embodiment, the material of the first conductive layer 151 may be polycrystalline silicon. A material of the second conductive layer 152 may include, but is not limited to W, Ti, Al (aluminum) or Pt (platinum), and the material of the first conductive layer 151 is different from the material of the second conductive layer 152. A material of the bit line insulating layer 153 may include, but is not limited to, silicon oxide, silicon nitride, or silicon oxynitride, etc., and the material of the bit line insulating layer 153 may be the same as the material of the first insulating layer 13.

In one embodiment, with reference to FIG. 3(b), the semiconductor structure further includes a second insulating layer 16, which is formed on the upper surface of the first insulating layer 13. The second insulating layer 16 fills up a gap between the plurality of bit lines 15, and the bit line insulating layer 153 is exposed.

As an example, a material of the second insulating layer 16 may include, but is not limited to, silicon oxide, silicon nitride, or silicon oxynitride, etc. The material of the second insulating layer 16 may be the same as the material of the bit line insulating layer 153 and/or the material of the first insulating layer 13.

As an example, the subsequent structural illustrations are all based on two interception directions as shown in FIG. 2 and FIG. 3.

In one embodiment, as shown in FIG. 4, a first supporting layer 21 and a first sacrificial layer 22 alternately stacked from up to down are formed in Step S2. The first supporting layer 21 and the first sacrificial layer 22 may be formed by means of the atomic layer deposition (ALD) process or the plasma chemical vapor deposition (PCVD) process. A material of the first supporting layer 21 and a material of the first sacrificial layer 22 are different, and an etching rate of the first supporting layer 21 and an etching rate of the first sacrificial layer 22 in the same etching process are different. In the same etching process, the etching rate of the first sacrificial layer 22 is much greater than that of the first supporting layer 21, such that after the first sacrificial layer 22 is completely removed, the first supporting layer 21 is almost completely retained. The first sacrificial layer 22 is a silicon oxide layer, and the material of the first supporting layer 21 may be silicon nitride.

Figure 5:
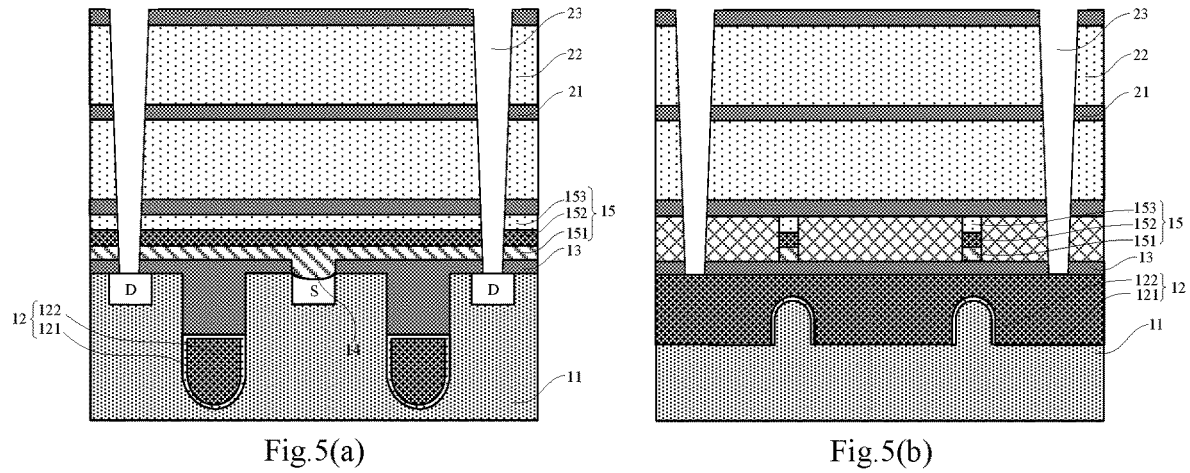

In one embodiment, as shown in FIG. 5, a first capacitor hole 23 is formed in Step S3, wherein the first capacitor hole 23 penetrates into the stacked structure (not shown) at least along a thickness direction to expose the first substrate 11 and expose the drain region D. A longitudinal cross-sectional shape of the first capacitor hole 23 may be set according to actual needs. The longitudinal cross-sectional shape of the first capacitor hole 23 may include a U shape, a rectangle, or an inverted trapezoid. In FIG. 5, as an example, the longitudinal cross-sectional shape of the first capacitor hole 23 is the inverted trapezoid to facilitate subsequent processes, but is not limited thereto.

As an example, a photoresist may be formed as a mask layer on the upper surfaces of the first supporting layer 21 and the first sacrificial layer 22 alternately stacked. Of course, in other examples, the mask layer (such as a silicon nitride hard mask layer) may also be formed of other materials. Next, the mask layer is patterned by means of a photolithography process to obtain a patterned mask layer configured to define the capacitor hole. Finally, the first supporting layer 21 and the first sacrificial layer 22 may be etched according to the patterned mask layer configured to define the capacitor hole by means of a dry etching process, a wet etching process, or a combination of the dry etching process and the wet etching process, to form the first capacitor hole 23 in the first supporting layer 21 and the first sacrificial layer 22.

Figure 6:
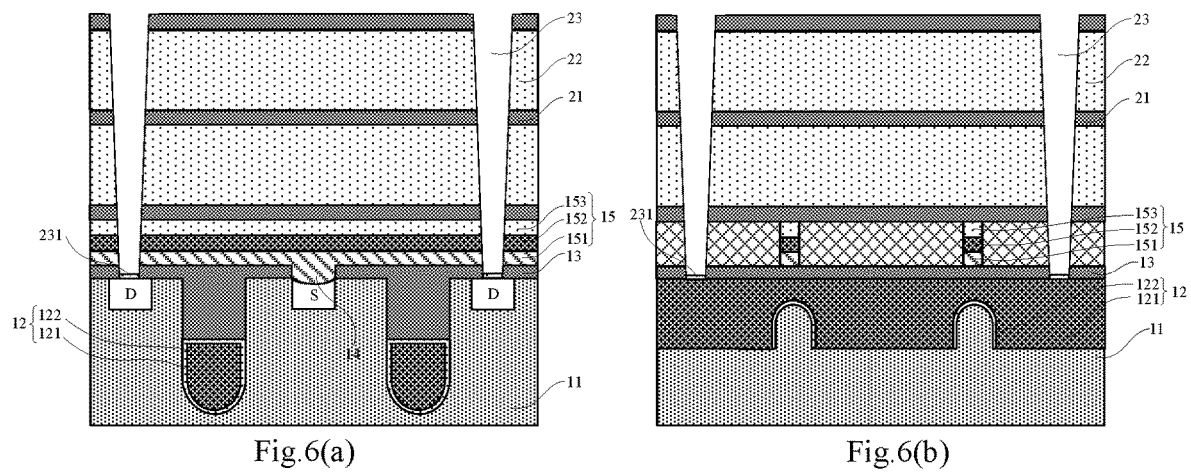

In one embodiment, as shown in FIG. 6, after the first capacitor hole 23 is formed and before the filling sacrificial layer 24 is formed in the first capacitor hole 23, the method further comprises forming a protective layer 231 at a bottom of the first capacitor hole. As shown in FIG. 6, after the filling sacrificial layer 24 is removed and before the first electrode layer 26 is formed, the method further comprises removing the protective layer 231. The first capacitor hole 23 penetrates into each of the plurality of bit lines 15 along the thickness direction, and the protective layer 231 is formed at the bottom of the first capacitor hole 23 that penetrates into each of the plurality of bit lines 15. A material of the filling sacrificial layer 24 and a material of the first substrate 11 are both Si. Before the filling sacrificial layer 24 is formed, the protective layer 231 of less than 1 nm is formed at the bottom of the first capacitor hole in advance, to effectively prevent from causing damage to the first substrate 11 in subsequent removal of the filling sacrificial layer 24.

As an example, the protective layer 231 comprises a silicon oxide layer, which has a thickness of 1 Å to 10 Å. In some embodiments, the thickness of the silicon oxide layer may be 1 Å, 2 Å, 3 Å, 4 Å, 5 Å, 6 Å, 8 Å, 9 Å, or 10 Å, and so on.

In one embodiment, as shown in FIG. 7, the filling sacrificial layer 24 is formed in the first capacitor hole 23, and the filling sacrificial layer 24 fills up the first capacitor hole 23. The filling sacrificial layer 24 is a polycrystalline silicon layer, wherein the polycrystalline silicon may be deposited for single or multiple times by means of the ALD process, the PCVD process, or the RTO process. Next, the first capacitor hole 23 is etched and circularly filled, and then the upper surface of the filling sacrificial layer 24 is polished by means of a chemical mechanical polish (CMP) process, to ensure that the upper surface of the filling sacrificial layer 24 is flush with the upper surface of the first supporting layer 21.

In one embodiment, as shown in FIG. 8, after the filling sacrificial layer 24 is formed in the first capacitor hole 23 and before the bonded wafer 31 is bonded to the stacked structure, the method further comprises forming a fourth supporting layer 25 on a surface of the stacked structure. The fourth supporting layer 25 covers the upper surface of the stacked structure and the upper surface of the filling sacrificial layer 24, to increase a bonding force of bonding the bonded wafer to the stacked structure, and thus to improve stability of the DRAM device.

As an example, a material of the fourth supporting layer 25 may be silicon nitride, and a fabrication process of the fourth supporting layer 25 may be the same as that of the first supporting layer 21.

Figure 10:
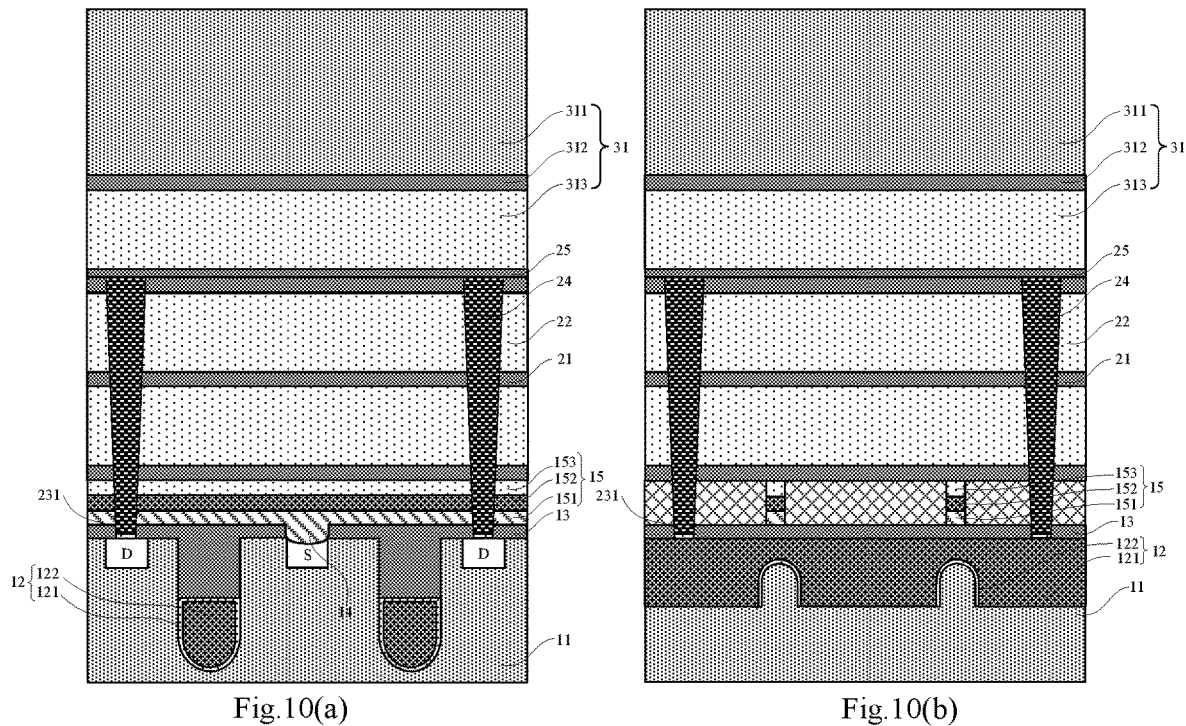

In one embodiment, as shown in FIG. 9, the bonded wafer 31 is provided in Step S4, wherein the bonded wafer 31 comprises a second substrate 311, a second supporting layer 312 and a second sacrificial layer 313 stacked in sequence. A material of the second substrate 311 may include, but is not limited to, Si, and the material of the second substrate 311 may be the same as that of the first substrate 11. A material of the second supporting layer 312 may be silicon nitride. The second sacrificial layer 313 and the first sacrificial layer 22 both are silicon oxide layers. As shown in FIG. 10, the bonded wafer 31 is bonded to the stacked structure in Step S5, wherein a surface of the second sacrificial layer 313 keeping away from the second supporting layer 312 is a bonding surface.

Figure 11:
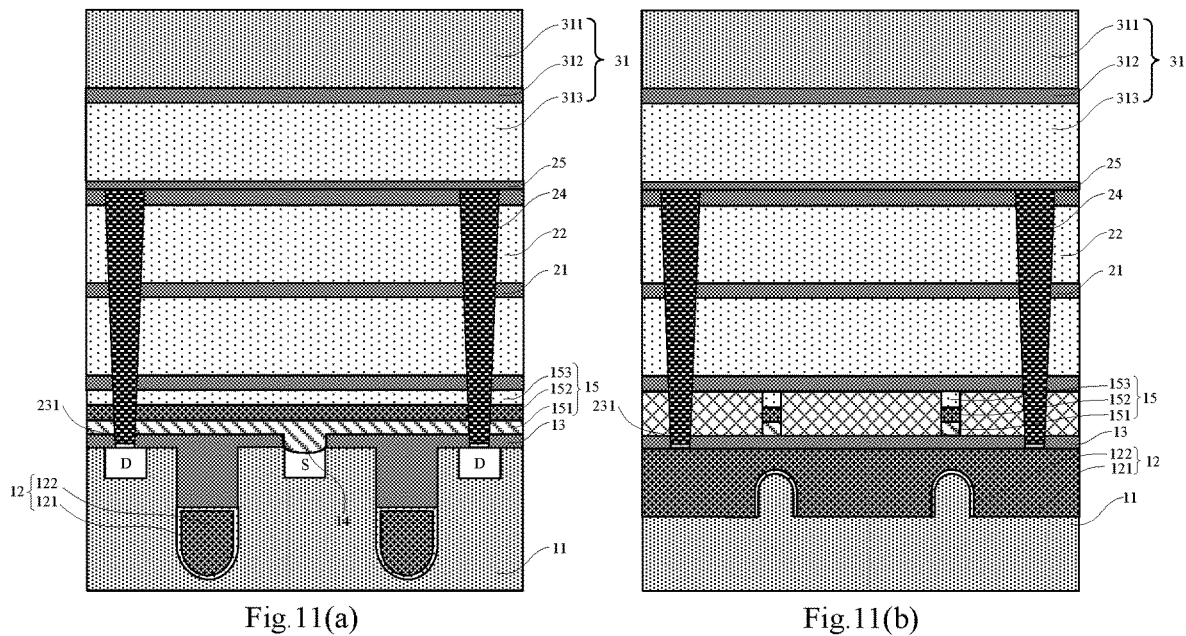

In one embodiment, as shown in FIG. 11, before the bonded wafer 31 is bonded to the stacked structure and the third supporting layer 32 is formed on the surface of the second substrate 311 keeping away from the second supporting layer 312, the method further comprises: thinning the second substrate 311. In some embodiments, a thickness of the thinned second substrate 311 is a quarter of a total depth of the first capacitor hole 23 and the second capacitor hole 33.

Figure 12:
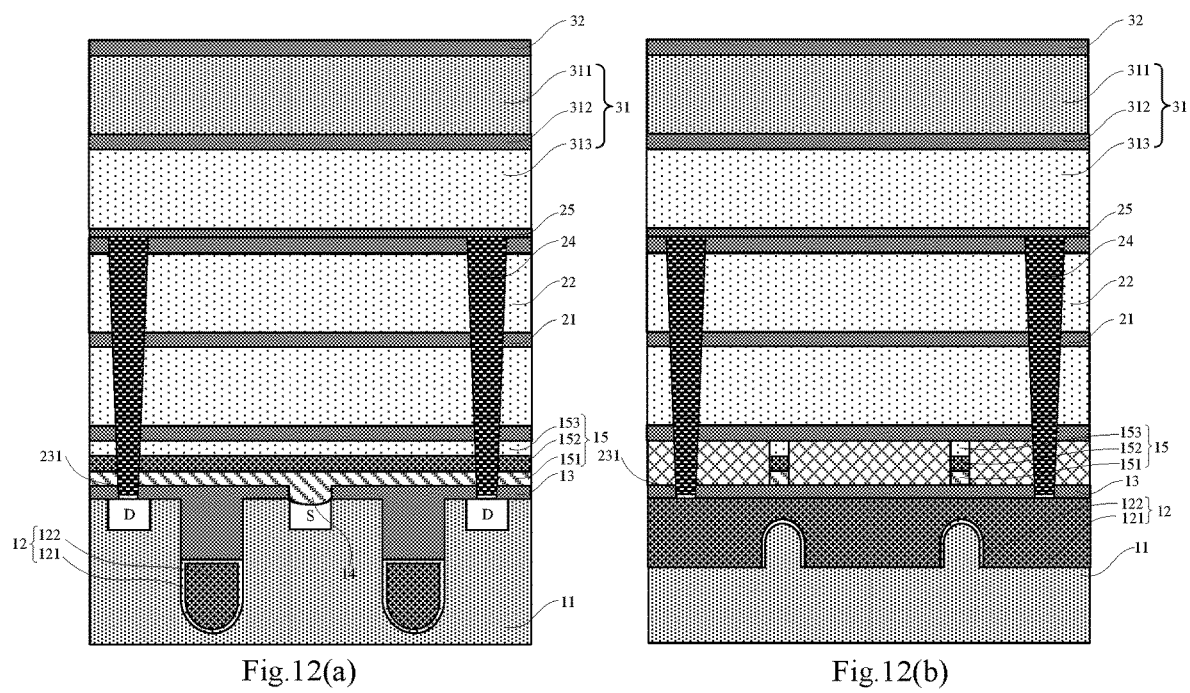

In one embodiment, as shown in FIG. 12, the third supporting layer 32 is formed on the surface of the second substrate 311 keeping away from the second supporting layer 312 in Step S6, such that the second substrate 311, the second sacrificial layer 313 and the first sacrificial layer 22 are removed after openings are formed subsequently, thereby playing a supporting role. As an example, silicon nitride may be selected as the third supporting layer 32.

Figure 13:
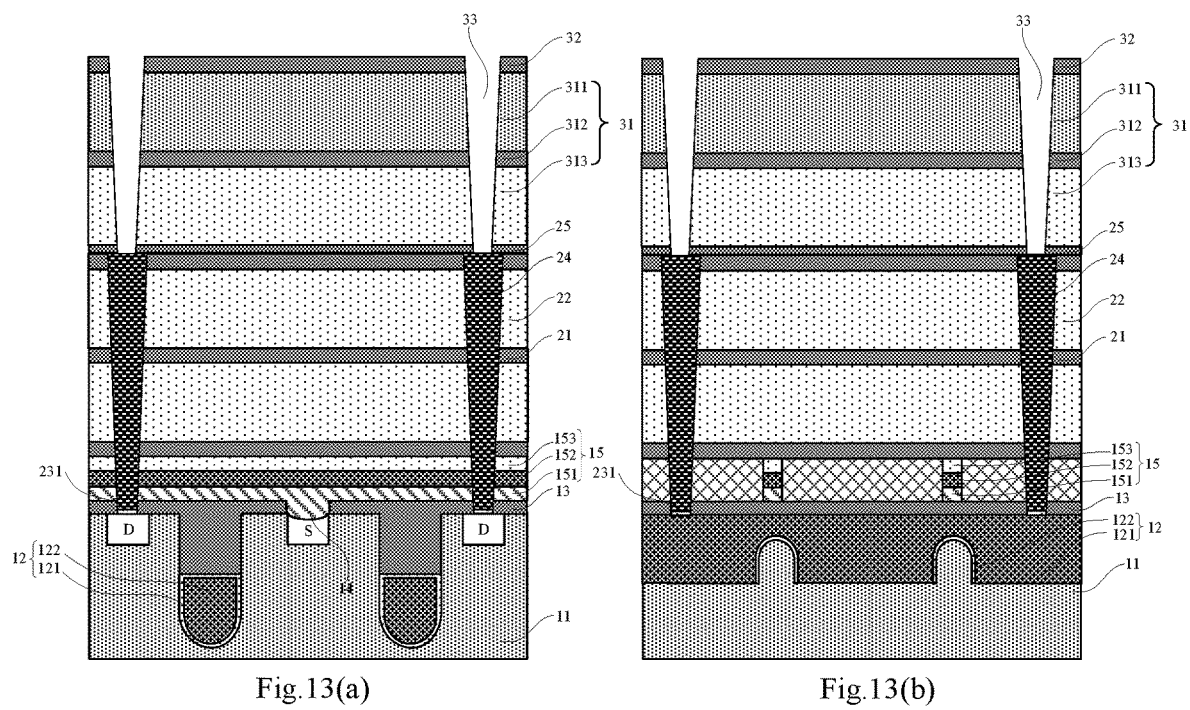

In one embodiment, as shown in FIG. 13, a second capacitor hole 33 is formed in Step S7, wherein the second capacitor hole 33 penetrates into the bonded wafer 31 at least along the thickness direction to expose the first capacitor hole 23. The etching process of the second capacitor hole 33 is the same as that of the first capacitor hole 23, and thus is not described in detail herein. The longitudinal cross-sectional shape of the second capacitor hole 33 is an inverted trapezoid to facilitate the subsequent depositions, and the sidewall of the first capacitor hole 23 and the sidewall of the second capacitor hole 33 are tilted at an angle of 5°-10° with respect to a direction perpendicular to an upper surface of the semiconductor structure. In some embodiments, the sidewall of the first capacitor hole 23 and the sidewall of the second capacitor hole 33 are tilted at an angle of 5°, 6°, 7°, 8°, 9°, or 10° and so on with respect to the direction perpendicular to the upper surface of the semiconductor structure.

In one embodiment, as shown in FIG. 14, the filling sacrificial layer 24 is removed, such that the first capacitor hole 23 is connected with the second capacitor hole 33. The filling sacrificial layer 24 may be removed by means of a wet or dry etching process, which is well known to those skilled in the art, and thus is not to be described in detail.

Figure 16:
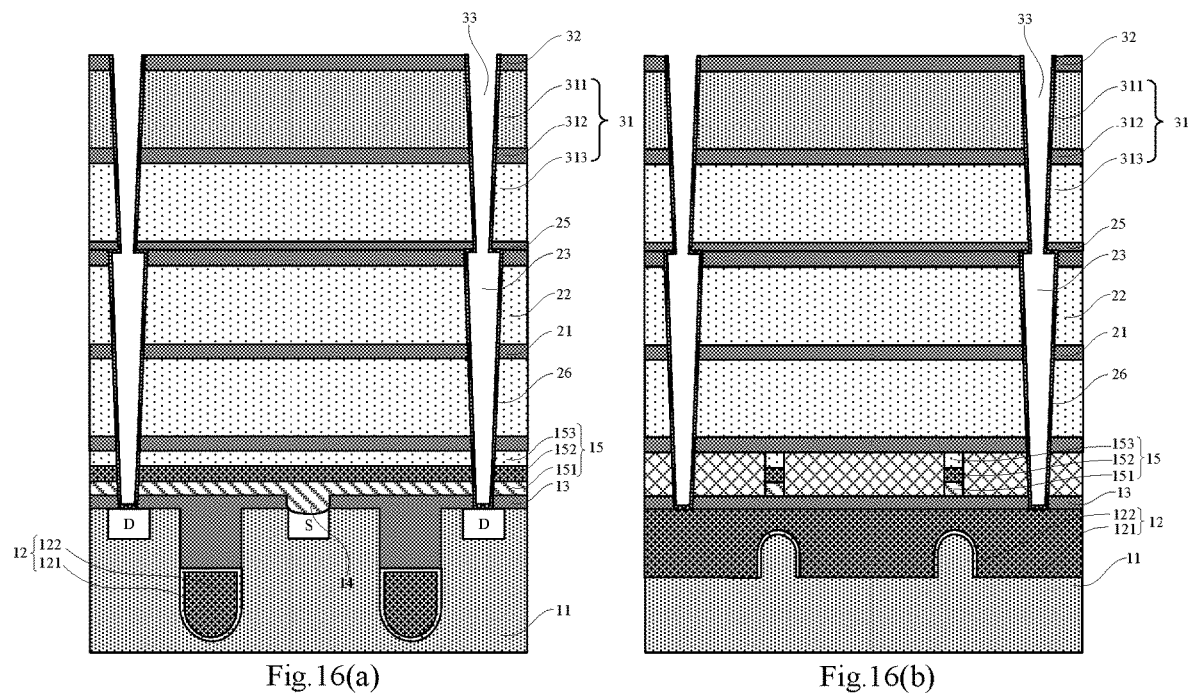

In one embodiment, as shown in FIG. 16, the first electrode layer 26 is formed on the sidewall of the first capacitor hole 23, the bottom of the first capacitor hole 23 and the sidewall of the second capacitor hole 33 in Step S8. As an example, the first electrode layer 26 is formed on the sidewall of the first capacitor hole 23, the bottom of the first capacitor hole 23 and the sidewall of the second capacitor hole 33 by means of the ALD process or the PCVD process. The first electrode layer 26 may include, but is not limited to, compounds formed from one or two of metal nitrides and metal silicides, such as titanium nitride, titanium silicide, nickel silicide, and $TiSi_xN_y$.

Figure 17:
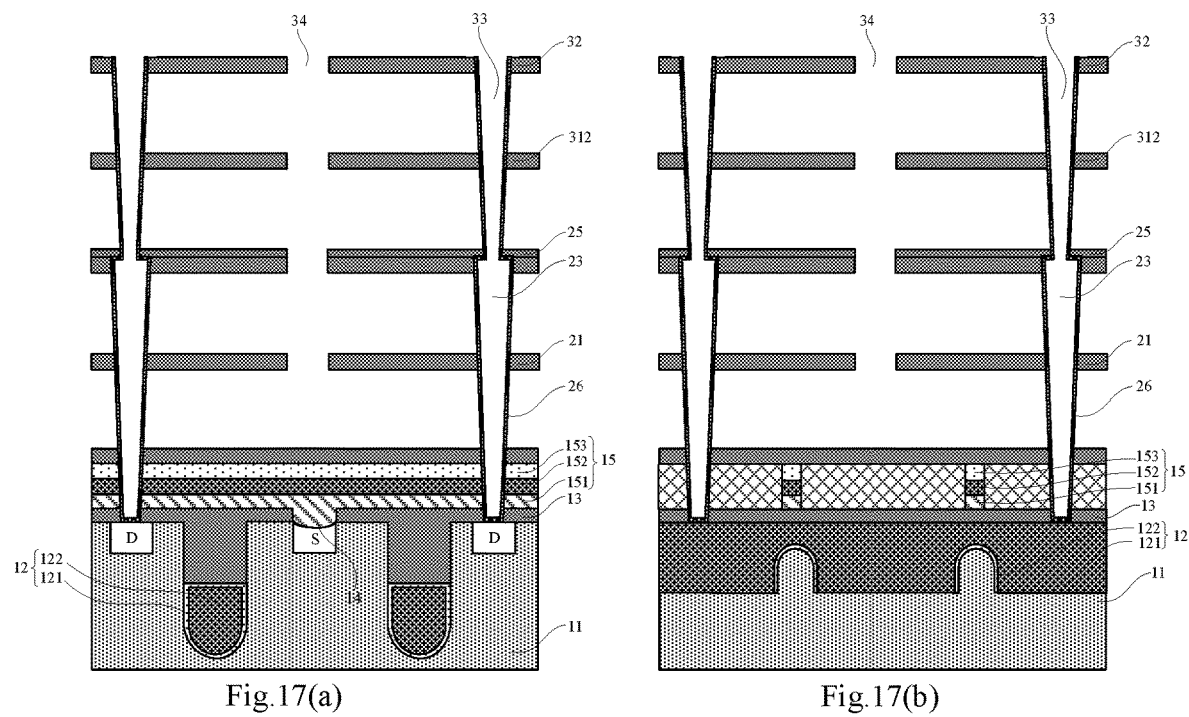

In one embodiment, as shown in FIG. 17, Step S9 of sequentially removing the second substrate 311, the second sacrificial layer 313 and the first sacrificial layer 22 also comprises:

Step S91: forming a patterned mask layer (not shown) on an upper surface of the third supporting layer 32, wherein the patterned mask layer has a plurality of opening patterns, and the plurality of opening patterns define a shape and a location of an opening 34;

Step S92: etching the third supporting layer 32 based on the patterned mask layer to form a first opening in the third supporting layer 32, wherein the first opening exposes the second substrate 311 positioned between the third supporting layer 32 and the second supporting layer 312;

Step S93: removing the second substrate 311 based on the first opening;

Step S94: forming a second opening in the second supporting layer 312 based on the first opening, wherein the second opening exposes the second sacrificial layer 313;

Step S95: removing the second sacrificial layer 313;

Step S96: forming a third opening on the fourth supporting layer 25 and the first supporting layer 21 based on the second opening, wherein the third opening exposes the first sacrificial layer 22; and Step S97: removing the first sacrificial layer 22 based on the third opening.

In one embodiment, as shown in FIG. 18, a capacitive dielectric layer 27 is formed on the surface of the first electrode layer 26 in Step S10. A high-K dielectric material may be selected as a material of the capacitive dielectric layer 27, to increase a capacitance value per unit area of the capacitor. The material of the capacitive dielectric layer 27 includes one of $ZrO_x$, $HfO_x$, $ZrTiO_x$, $RuO_x$, $SbO_x$, and $AlO_x$, or a stacked layer formed by at least two of groups comprised of these materials.

In one embodiment, as shown in FIG. 19, a second electrode layer 28 is formed on the surface of the capacitive dielectric layer 27 in Step S11. As an example, a material of the second electrode layer 28 may include one of tungsten, titanium, nickel, aluminum, platinum, titanium nitride, N-type polycrystalline silicon, and P-type polycrystalline silicon, or a stacked layer formed by at least two of groups comprised of these materials.

In one embodiment of the present disclosure, there is also provided a capacitor array structure, including: a semiconductor structure; a plurality of first supporting layers arranged in parallel at intervals on the semiconductor structure; a first capacitor hole, wherein the first capacitor hole penetrates into each of the plurality of first supporting layers at least along a thickness direction to expose the semiconductor structure; a second supporting layer, bonded to the semiconductor structure, wherein a spacing is provided between the second supporting layer and one of the plurality of first supporting layers positioned on a top layer; a third supporting layer, positioned on the second supporting layer, wherein a spacing is provided between the third supporting layer and the second supporting layer; a second capacitor hole, correspondingly arranged with respect to the first capacitor hole, wherein the second capacitor hole penetrates into the third supporting layer and the second supporting layer at least along the thickness direction to connect with the first capacitor hole; a first electrode layer, covering a sidewall of the first capacitor hole, a bottom of the first capacitor hole, and a sidewall of the second capacitor hole; a capacitor dielectric layer, covering a surface of the first electrode layer; and a second electrode layer, covering a surface of the capacitor dielectric layer. This capacitor array structure can effectively reduce difficulty of a capacitor etching process, such that a height of a capacitor is increased while a line width of the capacitor is reduced. In this way, capacity of a storage capacitor and storage density of a DRAM are improved, and a technical idea is provided for development of DRAM fabrication procedures.

As an example, the longitudinal cross-sectional shape of the second capacitor hole 33 is an inverted trapezoid, and the sidewall of the first capacitor hole 23 and the sidewall of the second capacitor hole 33 are tilted at an angle of 5°-10° with respect to a direction perpendicular to an upper surface of the semiconductor structure. In some embodiments, the sidewall of the first capacitor hole 23 and the sidewall of the second capacitor hole 33 are tilted at an angle of 5°, 6°, 7°, 8°, 9°, or 10° and so on with respect to the direction perpendicular to the upper surface of the semiconductor structure.

In one embodiment, the capacitor array structure further comprises a fourth supporting layer 25, wherein the fourth supporting layer 25 covers the upper surface of the first supporting layer 21 positioned at the top layer, and a spacing is provided between the second supporting layer 312 and the fourth supporting layer 25.

It is to be noted that the above embodiments are intended for purposes of illustration only and are not intended to limit the present disclosure.

The embodiments in the specification are described in a progressive manner. Each embodiment is focused on difference from other embodiments. And cross reference is available for identical or similar parts among different embodiments.

Technical features of the above embodiments may be arbitrarily combined. For simplicity, all possible combinations of the technical features in the above embodiments are not described. However, as long as the combination of these technical features is not contradictory, it shall be deemed to be within the scope recorded in this specification.

The above embodiments merely express a plurality of implementations of the present disclosure, and descriptions thereof are relatively concrete and detailed. However, these embodiments are not thus construed as limiting the patent scope of the present disclosure. It is to be pointed out that for persons of ordinary skill in the art, some modifications and improvements may be made under the premise of not departing from a conception of the present disclosure, which shall be regarded as falling within the scope of protection of the present disclosure. Thus, the scope of protection of the present disclosure shall be subject to the appended claims.

What is claimed is:

1. A capacitor array structure, comprising:
a semiconductor structure;
a plurality of first supporting layers arranged in parallel at intervals on the semiconductor structure;
a first capacitor hole, the first capacitor hole penetrating into each of the plurality of first supporting layers at least along a thickness direction to expose the semiconductor structure;
a second supporting layer, bonded to the semiconductor structure, a spacing being provided between the second supporting layer and one of the plurality of first supporting layers positioned on a top layer;
a third supporting layer, positioned on the second supporting layer, a spacing being provided between the third supporting layer and the second supporting layer;
a second capacitor hole, correspondingly arranged with respect to the first capacitor hole, the second capacitor hole penetrating into the third supporting layer and the second supporting layer at least along the thickness direction to connect with the first capacitor hole;
a first electrode layer, covering a sidewall of the first capacitor hole, a bottom of the first capacitor hole, and a sidewall of the second capacitor hole;
a capacitor dielectric layer, covering a surface of the first electrode layer; and
a second electrode layer, covering a surface of the capacitor dielectric layer.

2. The capacitor array structure according to claim 1, wherein a longitudinal cross-sectional shape of the first capacitor hole and a longitudinal cross-sectional shape of the second capacitor hole are both inverted trapezoids, the sidewall of the first capacitor hole and the sidewall of the second capacitor hole being tilted at an angle of 5°-10° with respect to a direction perpendicular to an upper surface of the semiconductor structure.

3. The capacitor array structure according to claim 1, wherein the semiconductor structure comprises a first substrate, a shallow trench isolation structure being formed in the first substrate, a plurality of active regions arranged in an array being isolated in the first substrate by the shallow trench isolation structure;
the semiconductor structure further comprises a plurality of buried gate word lines and a plurality of bit lines, the plurality of buried gate word lines extending along a first direction, the plurality of bit lines extending in a second direction, the first direction and the second direction having an angle greater than 0° and less than or equal to 90°;

wherein each of the plurality of active regions stretches across two of the plurality of buried gate word lines, a source region and a drain region being formed in each of the plurality of active regions, the source region being positioned between two of the plurality of buried gate word lines stretched across by each of the plurality of active regions, and the drain region being positioned outside two of the plurality of buried gate word lines stretched across by each of the plurality of active regions.

4. The capacitor array structure according to claim 3, wherein a first insulating layer is formed in the semiconductor structure, the first insulating layer being positioned on an upper surface of each of the plurality of buried gate word lines and an upper surface of the first substrate; each of the plurality of bit lines is connected to the source region via a bit line contact structure, the first capacitor hole exposing the drain region.

5. The capacitor array structure according to claim 4, wherein each of the plurality of bit lines comprises a first conductive layer, a second conductive layer and a bit line insulating layer sequentially stacked from bottom to top, the first conductive layer being positioned on an upper surface of the first insulating layer, and the first conductive layer being connected to the source region via the bit line contact structure.

6. The capacitor array structure according to claim 1, further comprising a fourth supporting layer, the fourth supporting layer covering an upper surface of a first supporting layer positioned on the top layer, wherein a spacing is provided between the second supporting layer and the fourth supporting layer.

7. A method for fabricating a capacitor array structure, comprising:
providing a semiconductor structure;
forming, on the semiconductor structure, a stacked structure comprising a first sacrificial layer and a first supporting layer alternately stacked from up to down;
forming a first capacitor hole, the first capacitor hole penetrating into the stacked structure at least along a thickness direction;
providing a bonded wafer comprising a second substrate, a second supporting layer and a second sacrificial layer stacked in sequence;
bonding the bonded wafer to the stacked structure, wherein a surface of the second sacrificial layer keeping away from the second supporting layer is a bonding surface;
forming a third supporting layer on a surface of the second substrate keeping away from the second supporting layer;
forming a second capacitor hole, the second capacitor hole penetrating into the bonded wafer at least along the thickness direction to connect with the first capacitor hole;
forming a first electrode layer on a sidewall of the first capacitor hole, a bottom of the first capacitor hole and a sidewall of the second capacitor hole;
sequentially removing the second substrate, the second sacrificial layer, and the first sacrificial layer;
forming a capacitor dielectric layer on a surface of the first electrode layer; and
forming a second electrode layer on a surface of the capacitor dielectric layer.

8. The method for fabricating a capacitor array structure according to claim 7, wherein after forming the first capacitor hole and before providing the bonded wafer, the method further comprises forming a filling sacrificial layer in the first capacitor hole, the filling sacrificial layer filling up the first capacitor hole; and after forming the second capacitor hole and before forming the first electrode layer, the method further comprises removing the filling sacrificial layer.

9. The method for fabricating a capacitor array structure according to claim 8, wherein the first sacrificial layer and the second sacrificial layer are both silicon oxide layers, the filling sacrificial layer being a polycrystalline silicon layer.

10. The method for fabricating a capacitor array structure according to claim 8, wherein after forming the filling sacrificial layer in the first capacitor hole and before bonding the bonded wafer to the stacked structure, the method further comprises forming a fourth supporting layer on a surface of the stacked structure, the fourth supporting layer covering an upper surface of the stacked structure and an upper surface of the filling sacrificial layer; and the surface of the second sacrificial layer keeping away from the second supporting layer and a surface of the fourth supporting layer keeping away from the first supporting layer both are bonding surfaces.

11. The method for fabricating a capacitor array structure according to claim 8, wherein before bonding the bonded wafer to the stacked structure and forming the third supporting layer on the surface of the second substrate keeping away from the second supporting layer, the method further comprises:
thinning the second substrate.

12. The method for fabricating a capacitor array structure according to claim 11, wherein a thickness of the thinned second substrate is a quarter of a total depth of the first capacitor hole and the second capacitor hole.

13. The method for fabricating a capacitor array structure according to claim 10, wherein the sequentially removing the second substrate, the second sacrificial layer and the first sacrificial layer comprises:
forming a patterned mask layer on an upper surface of the third supporting layer, the patterned mask layer having a plurality of opening patterns, and the plurality of opening patterns defining shapes and locations of openings;
etching the third supporting layer based on the patterned mask layer to form a first opening in the third supporting layer, the first opening exposing the second substrate positioned between the third supporting layer and the second supporting layer;
removing the second substrate based on the first opening;
forming a second opening in the second supporting layer based on the first opening, the second opening exposing the second sacrificial layer;
removing the second sacrificial layer;
forming a third opening on the fourth supporting layer and the first supporting layer based on the second opening, the third opening exposing the first sacrificial layer; and
removing the first sacrificial layer based on the third opening.

14. The method for fabricating a capacitor array structure according to claim 10, wherein after forming the first capacitor hole and before forming the filling sacrificial layer in the first capacitor hole, the method further comprises forming a protective layer at a bottom of the first capacitor hole; and after removing the filling sacrificial layer and before forming the first electrode layer, the method further comprises removing the protective layer.

15. The method for fabricating a capacitor array structure according to claim 14, wherein the protective layer comprises a silicon oxide layer, the silicon oxide layer having a thickness of 1 Å to 10 Å.

\* \* \* \* \*